United States Patent
Pelz

Patent Number: 6,021,518
Date of Patent: Feb. 1, 2000

[54] METHOD FOR OBTAINING INFORMATION ON THE RESIDUAL ERRORS IN A TRANSMITTED CHANNEL-DECODED DIGITAL SIGNAL

[75] Inventor: Rodolfo Mann Pelz, Hannover, Germany

[73] Assignee: Robert Bosch GmbH, Stuttgart, Germany

[21] Appl. No.: 08/738,682

[22] Filed: Oct. 28, 1996

[51] Int. Cl.[7] ............................ G06F 11/00; G08C 25/00; H03M 13/00; H04L 1/00

[52] U.S. Cl. ............................ 714/799; 714/723

[58] Field of Search ................... 371/48, 21.6; 714/799, 714/723

[56] References Cited

U.S. PATENT DOCUMENTS

| 5,490,177 | 2/1996 | La Rosa et al. | 375/329 |
| 5,737,345 | 4/1998 | Pelz et al. | 371/43.1 |

FOREIGN PATENT DOCUMENTS

| 4137609 | 5/1983 | Germany | H03M 13/00 |

OTHER PUBLICATIONS

Joachim Hagenauer, Peter Hoeher; "A Viterbi Algorithm with Soft–Decision Outputs and its Applications"; at Global Telecommunications Conf., Dallas, Texas, 1989; German Aerospace Research Establishment; pp. 1680–1686.

Johannes Huber, Alfred Rüppel; "Zuverlässigkeitsschätzung Für Die Ausgangssymbole von Trellis–Decodern"; Institut für Nachrichtentechnik, Universität der Bundeswehr München; pp. 8–21; Aeü, Band 44 (1990).

Derwent record for DE 41 37 609.

*Primary Examiner*—Phung M. Chung

[57] ABSTRACT

Reliability information obtained during the channel decoding of the transmitted signal is averaged over the short term; the short-term average reliability information is mapped to detect residual errors. The variable obtained by the mapping step is compared with at least one decision threshold, and the result of the comparison is transmitted as residual error information. In addition, the reliability information can also be averaged over the long term, the variable obtained by the mapping step being modified by the long-term average reliability information.

5 Claims, 3 Drawing Sheets

METHOD FOR OBTAINING INFORMATION ON THE RESIDUAL ERRORS IN A TRANSMITTED CHANNEL-DECODED DIGITAL SIGNAL

BACKGROUND OF THE INVENTION

The invention pertains to a method for obtaining information on the residual errors in a transmitted channel-decoded digital signal, especially in respect to the transmission of images over mobile radio channels.

Not only block encoding but also "folding" encoding are used to protect the transmission of signals (video, audio, data) from error. One of the standard ways of decoding folding encoding is based on the so-called "maximum likelihood criterion", according to which the encoded word which is decoded is the one most likely to have been transmitted. The associated decoding instructions are efficiently carried out by means of the Viterbi algorithm. When a so-called "soft" decision is used for decoding, not only the binary symbols but also certain "reliability information" is used in the decoding process. As a result, a gain can be achieved with respect to the required signal-to-noise ratio on the channel. On the basis of the Viterbi algorithm, methods have become known which make it possible to obtain reliability information pertaining to the channel-decoded symbols. This reliability information can be used advantageously, for example, for error masking (as described in DE 41 37 609 A1), for adaptive error correction, or for chained encoding. It represents a measure of the instantaneous transmission error. There is no point in making direct use of the reliability information obtained in the form of symbols, however, because the probability that a symbol has been falsely decoded is less than 0.5. A Viterbi algorithm with soft-decision output signals and its applications are described in J. Hagenauer and P. Hoeher: "A Viterbi algorithm with soft-decision outputs and its applications", Proc. IEEE GLOBECOM '90, Dallas, Tex., pp. 47.1.1–47.1.7, November 1989.

SUMMARY OF THE INVENTION

The object of the present invention is to derive information on the residual error from the reliability information which is obtained during decoding processes of this type.

In accordance with the invention reliability information is obtained during the channel decoding of the transmitted signal; the reliability information is averaged over the short term; the reliability information averaged over the short term is mapped to detect residual error; the variable obtained by mapping is compared with at least one decision threshold; and the result of the comparison is transmitted as the residual error information. It is preferable for the short-term averaging to be carried out in each case over one block of the channel-decoded signal.

The reliability information can be obtained by the application of the soft-output Viterbi algorithm or by other methods, such as those described J. Huber and A. Rüpel: "Zurerlässigkeitsschätzung für die Ausgangssymbole von Trellis-Decodern",[Reliability Estimation for the Output Sysmbols of Trellis Decoders], AEÜ, Vol. 44, No. 1, pp. 8–21, 1990.

A preferred area of application of the method is the transmission of images over mobile radio channels. The method is also advantageously applicable to any multimedia application involving error-protected digital transmission.

The error information obtained by means of the method can be used for error masking, among other purposes; as a result, the residual error remaining after channel decoding exerts a much reduced effect on the quality of the images. The information can also be transmitted over a return channel and used to control an encoder in such a way as to minimize the residual error.

The method according to the invention offers the advantage that no additional redundancy (such as additional parity bits) needs be added to the transmitted signal in order to recognize residual errors.

The reliability information is also averaged over the long term and in that the variable obtained by the mapping step is modified by the reliability information averaged over the long term. As a result, it is possible in particular to increase the reliability of the information on residual error, especially when a single decision threshold is used, which leads to a single conclusion differentiating between "no error" and "one or more errors".

In the preferred embodiment the variable obtained by the mapping step is multi plied by an additional variable obtained by the mapping of the long-term average reliability information to detect residual error.

The long-term averaging can be done by averaging several successive short-term averages. This reduces the computing power demanded of the signal processor executing the method according to the invention.

The method according to the invention gives good results when the mapping of the averaged reliability information is carried out in each case by means of a decreasing function, especially when the short-term average reliability information is mapped with the help of a continuously decreasing function, preferably a polynomial, to detect residual error.

Details on the course of the function can be determined by the expert in the individual case on the basis of the special application in question and the specific signals to be processed.

The long-term average reliability information can be mapped to detect residual error by means of a decreasing function which has a negative discontinuity in the middle value range. As a result, the values of the long-term average reliability information are considerably reduced, which means that the subsequent signal processing becomes much simpler.

DETAILED DESCRIPTION OF THE PREFERRED EMBODIMENT

Figure 1:
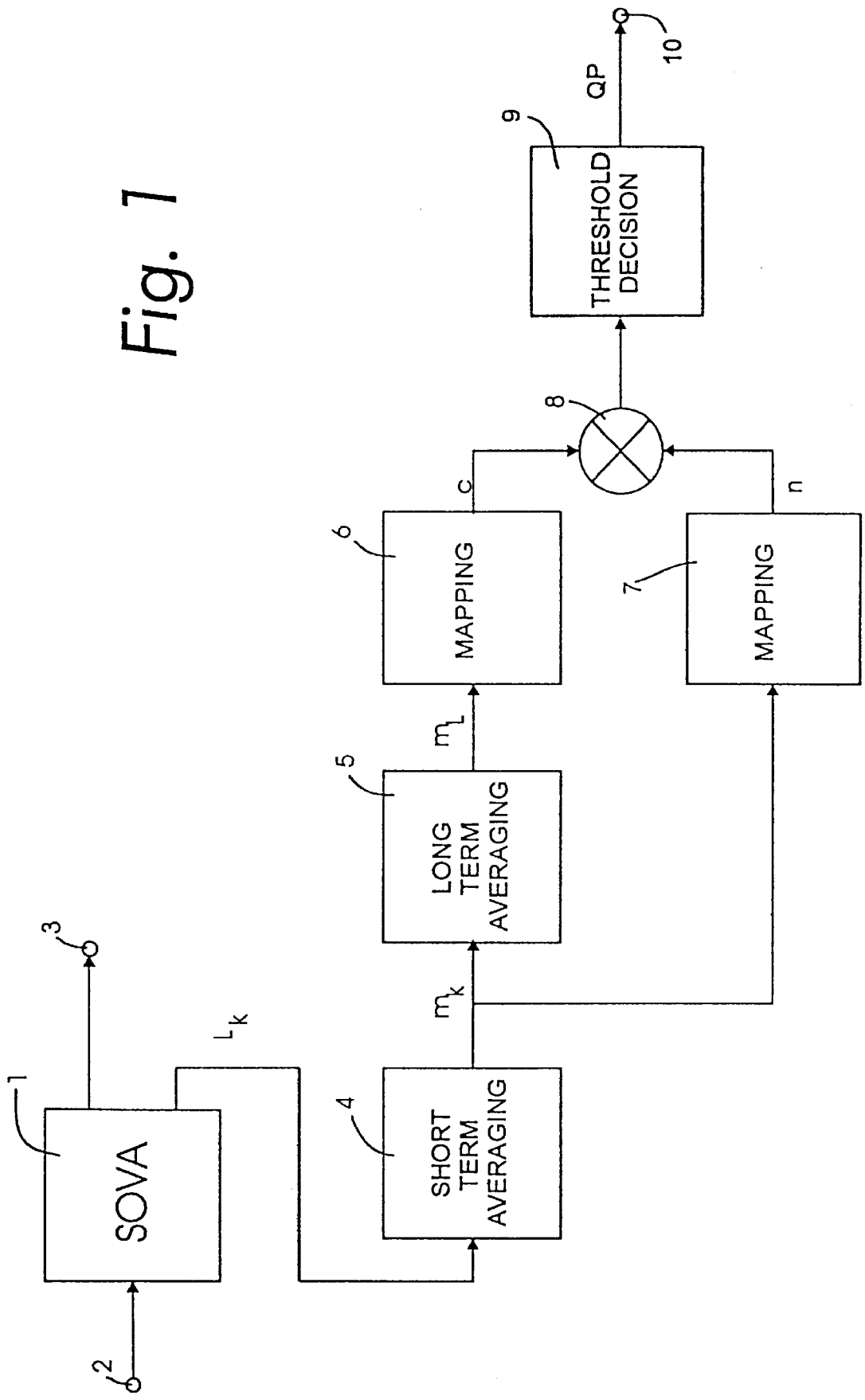
FIG. 1 shows a functional block diagram of a device for implementing the method according to the invention.

The exemplary embodiment and parts thereof are illustrated in terms of functional block diagrams. This does not mean however, that the method is limited to a realization by means of circuits corresponding to the individual blocks. On the contrary, the method according to the invention can be implemented in an especially advantageous manner by means of highly integrated circuits. Digital signal processors can be used, which, when suitably programmed, will execute all the processing steps illustrated in the functional block diagrams.

Before the method is explained on the basis of the exemplary embodiment according to FIG. 1, the transmission of signals, such as video signals, will be explained with the help of FIG. 2, where the method is used to obtain information on the residual error. At 11, the signals to be transmitted arrive first at a source encoder 12 and then pass on to a channel encoder 13, which operates according to the "folding" method. The channel-encoded signals are then sent to an interleaving unit 14, which, in the manner known in and of itself, reduces the sensitivity of the channel-encoded signals to interference in channel 15.

After a deinterleaving 16, channel decoding 1 is carried out. The channel decoder has an input 2 and an output 3 for the channel-decoded signal; it also has an output 17 for reliability information. The channel-decoded signal passes from output 3 of channel decoder 1 to a source decoder 18, at the out put 19 of which the transmitted, decoded signal is available for further use, such as for the reproduction of a recorded image. Output 17 of channel decoder 1 is connected to the input of a device 20, at output 10 of which a measure for the residual error is made available. In the concrete example according to FIG. 2, this measure, referred to as "QP" in the following, is sent to source decoder 18, where it is used to mask the errors if the signals have suffered from interference. This masking can consist, for example, in the replacement of an error-afflicted block within an image with the corresponding block of the preceding image.

Figure 2:
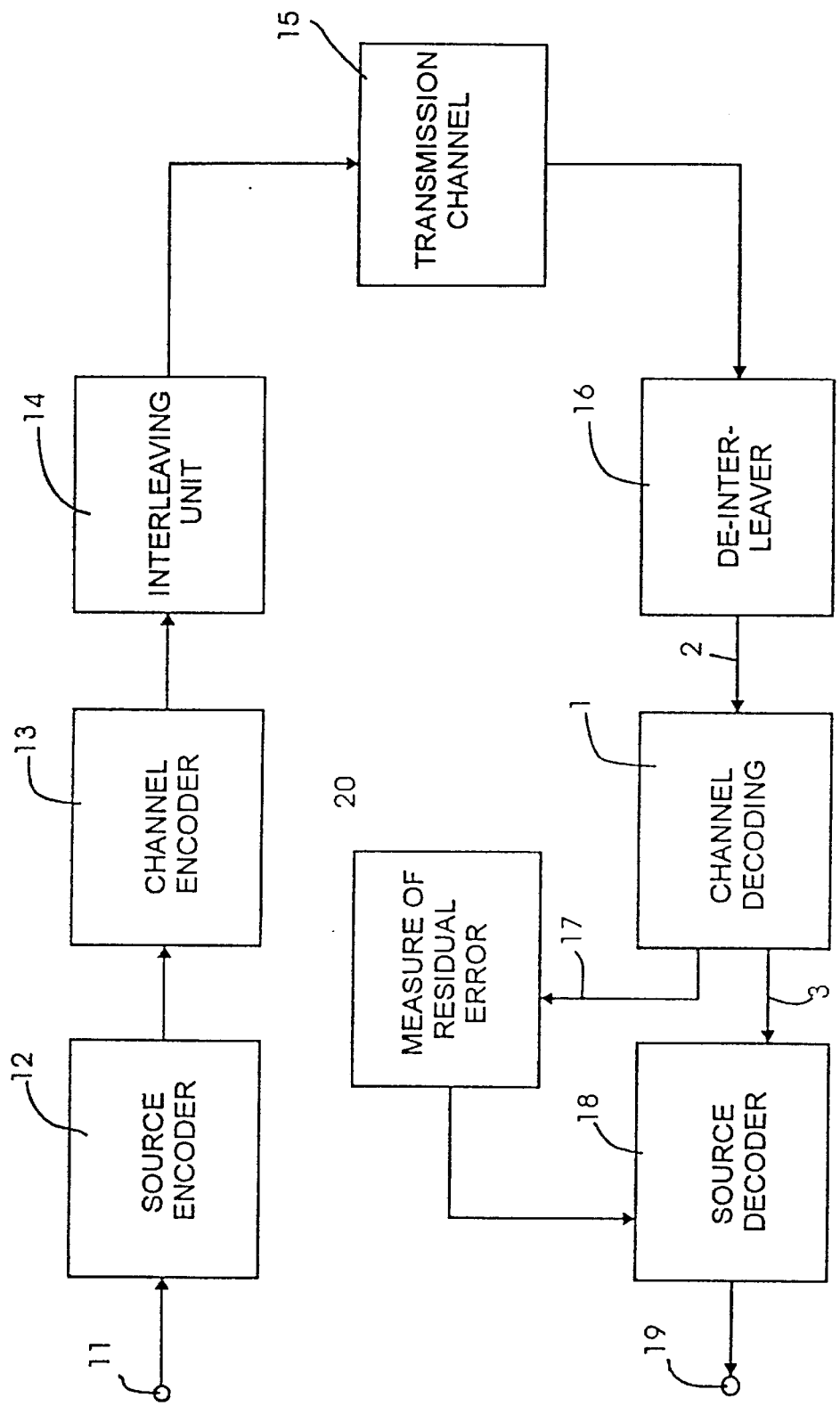
FIG. 2 shows a functional block diagram of a signal transmission, in which the method is used for error masking.

In the device according to FIG. 1, the reliability information is first sent from channel decoder 1 to an average value former 4, which averages the reliability information $L_k$ over a short period of time, i.e., in the case of this exemplary embodiment, over one block i in each case. This is done in accordance with the equation:

$$m_K(i) = \frac{1}{K} \cdot \sum_{k=0}^{K-1} L_k(i)$$

where K is the number of symbols per block, and i is the index of the block in question.

Because channels affected by memory are involved, such as mobile radio channels, the resulting transmission errors show a pronounced statistical pattern (bundle errors). In cases where the transmitted symbols have been subjected to only limited interleaving, there is also a statistical pattern in the decoded symbols and the associated reliability information. This also occurs when encoding with insufficient correctability is used.

Use can be made of this additional information by averaging the short-term averages of the reliability information over the long term. For this purpose, the short-term averages ($m_K$) are averaged at 5 according to the equation:

$$m_L(i) = \frac{1}{K} \cdot \sum_{k=i-1-M}^{i-1} m_K(k), i > M$$

where M is the number of averaged blocks (memory).

The short-term averages $m_K$ and the long-term averages $m_L$ are mapped at 6 and 7 to detect residual error by means of decreasing functions. The output variables of functions 6 and 7 are multiplied at 8. The resulting product is sent via a threshold value switch 9 to output 10 and is available there as signal QP. This is a measure of the residual errors per block; it states only whether errors are present in a block, not how many errors there are.

Figure 3:
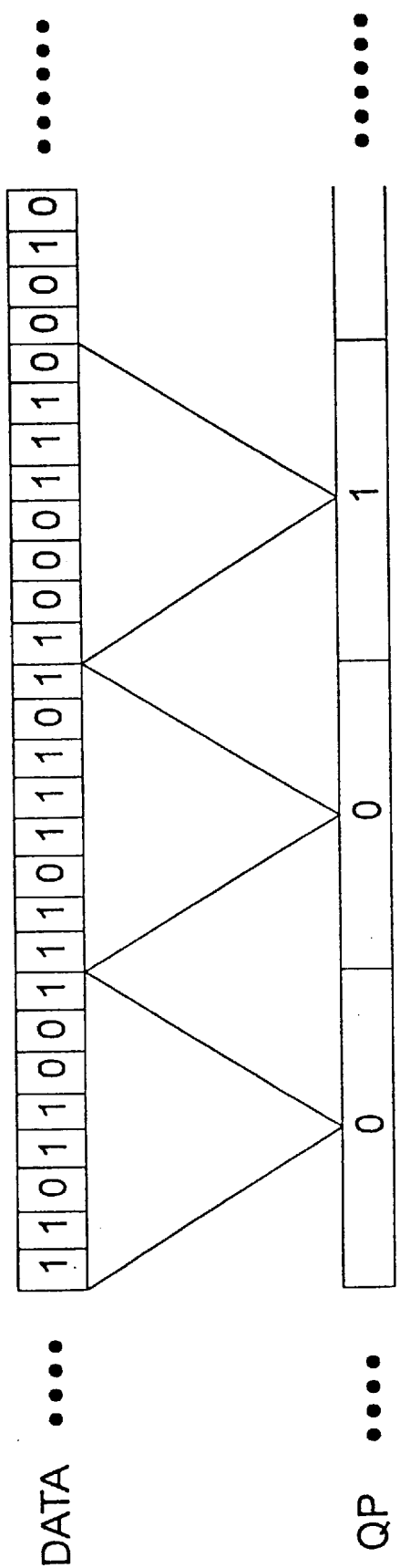
FIG. 3 shows a schematic diagram of the assignment of the residual error information to individual blocks.

FIG. 3 shows schematically the relationship between the channel-decoded data stream DATA with 8 bits per block and the error bitstream QP; two blocks are free of errors and one block has been recognized as containing an error. In the latter case, signal QP takes on a value of 1.

I claim:

1. Method for obtaining information on the residual errors in a transmitted channel-decoded digital signal, said method comprising:

obtaining reliability information during the channel decoding of the transmitted signal;

averaging the reliability information over a short term;

mapping the short-term average reliability information to detect residual errors;

comparing the variable obtained by mapping with at least one decision threshold; and modifying said channel decoded signal based on said residual error information, wherein the reliability information is also averaged over the long term, and in that the variable obtained by the mapping step is modified by the long-term average reliability information and wherein the variable is modified by multiplying the variable obtained by the mapping step by an additional variable obtained by the mapping of the long-term average reliability information to detect residual error.

2. Method according to claim 1, wherein the short-term averaging is done over one block of the channel-decoded signals in each case.

3. Method according to claim 1, wherein the mapping of the averaged reliability information is carried out by means of a decreasing function in each case.

4. Method according to claim 3, wherein the short-term average reliability information is mapped to detect residual error by means of a continuously decreasing function.

5. Method according to claim 4, wherein the continuously decreasing function is a polynomial.

* * * * *